(12) United States Patent
Cheng

(10) Patent No.: US 12,096,593 B2
(45) Date of Patent: Sep. 17, 2024

(54) INLET MODULE, HOUSING AND ELECTRONIC DEVICE

(71) Applicant: CHROMA ATE INC., Taoyuan (TW)

(72) Inventor: Po-Kai Cheng, Taoyuan (TW)

(73) Assignee: Chroma ATE Inc., Taoyuan (TW)

( * ) Notice: Subject to any disclaimer, the term of this patent is extended or adjusted under 35 U.S.C. 154(b) by 203 days.

(21) Appl. No.: 17/969,207

(22) Filed: Oct. 19, 2022

(65) Prior Publication Data

US 2023/0127994 A1  Apr. 27, 2023

(30) Foreign Application Priority Data

Oct. 22, 2021 (TW) ................................. 110212490

(51) Int. Cl.
*H05K 7/20* (2006.01)
(52) U.S. Cl.
CPC ..... *H05K 7/20145* (2013.01); *H05K 7/20172* (2013.01); *H05K 7/20436* (2013.01)

(58) Field of Classification Search
CPC ....................................................... H05K 5/00
See application file for complete search history.

(56) References Cited

U.S. PATENT DOCUMENTS

2007/0129000 A1* 6/2007 Rasmussen ........ H05K 7/20572
454/184
2008/0266789 A1* 10/2008 Hruby ............... H05K 7/20572
361/692

* cited by examiner

*Primary Examiner* — Jerry Wu
(74) *Attorney, Agent, or Firm* — Fish & Richardson P.C.

(57) ABSTRACT

An inlet module is adapted to be disposed on a housing of an electronic device, and includes an insert board and at least one adjusting plate. The insert board has a plurality of first air passages, at least one second air passage, and at least one positioning unit. The second air passage is located between two of the first air passages, and has an area larger than that of each first air passage. The adjusting plate has an opening having an area smaller than that of the second air passage. The adjusting plate is operable to be positioned at a position where the opening and the second air passage are overlapped with each other, thereby reducing an area of the airflow passing through the second air passage.

13 Claims, 6 Drawing Sheets

INLET MODULE, HOUSING AND ELECTRONIC DEVICE

CROSS-REFERENCE TO RELATED APPLICATION

This application claims priority to Taiwanese Utility Model Patent Application 110212490, filed on Oct. 22, 2021.

FIELD

The present disclosure relates to an inlet module for a heat dissipation system of an electronic device, and more particularly to an inlet module having an adjustable duct size, a housing, and an electronic device.

BACKGROUND

In the semiconductor industry, various functions of integrated circuit (hereinafter abbreviated as IC) elements are produced to respond to different demands of use. To check the quality of the IC elements, producers need to utilize the IC tester to detect whether or not the functionality of the IC elements is normal.

An existing IC tester is provided with multiple test boards in the housing for testing various functions of the IC elements. Since heat is created during operation of the test boards, to increase heat dissipation performance of the test boards, the test personnel needs to draw an air flow into the housing by a fan, and to draw heat away from the test boards to increase the heat dissipation performance of the test boards. In order to achieve a better flow rate when the air flow passes through each test board, heat ducts corresponding to the positions of each test board are provided at the inlet end of the housing, and the area of each heat duct is designed to generate a flow rate that corresponds to heat dissipation of the corresponding test board.

However, when testing different IC elements, some of the test boards need to be replaced. When the required heat duct area of the test board is different from the original test board, the heat dissipation performance is affected.

SUMMARY

Therefore, an object of the disclosure is to provide an inlet module having an adjustable duct size.

According to the disclosure, an inlet module is adapted to be disposed on a housing of an electronic device. The inlet module includes an insert board and at least one adjusting plate. The insert board has a board body, a plurality of first air passages that are formed by hollowing out the board body, at least one second air passage that is formed by hollowing out the board body, and at least one positioning unit. The first and second air passages are disposed side by side in a first direction. The second air passage is located between two of the first air passages. The second air passage has an area that is larger than that of each first air passage. The positioning unit is disposed on the board body at a position that corresponds to the second air passage, and includes two first positioning portions that are respectively proximate to two ends of the second passage. The at least one adjusting plate has a plate body, an opening that is formed in the plate body and that has an area smaller than that of the second air passage, and two second positioning portions that are disposed on the plate body. The adjusting plate is selectively usable to connect the second positioning portions respectively to the first positioning portions so that the adjusting plate is positioned and that the opening and the second air passage are overlapped with each other, thereby reducing an area of the airflow passing through the second air passage.

Another object of the disclosure is to provide a housing having the abovementioned inlet module.

Accordingly, the housing includes a housing body and the abovementioned inlet module. The housing body defines a receiving space, and has an inlet end and an outlet end that are disposed at two opposite sides. The receiving space has a fan-mounting region that is adjacent to the outlet end. The inlet module is disposed in the housing body, and is adjacent to the inlet end.

Another object of the disclosure is to provide an electronic device having the abovementioned housing.

Accordingly, the electronic device includes the abovementioned housing, a fan unit, and an electronic unit. The fan unit is disposed in the fan-mounting region for guiding an air flow to enter the housing from the inlet end and to exit the housing from the outlet end. The electronic unit is disposed in the receiving space.

BRIEF DESCRIPTION OF THE DRAWINGS

Other features and effects related to the present disclosure will be clearly, presented in the embodying manner with reference to the drawings, in which.

DETAILED DESCRIPTION

Figure 1:
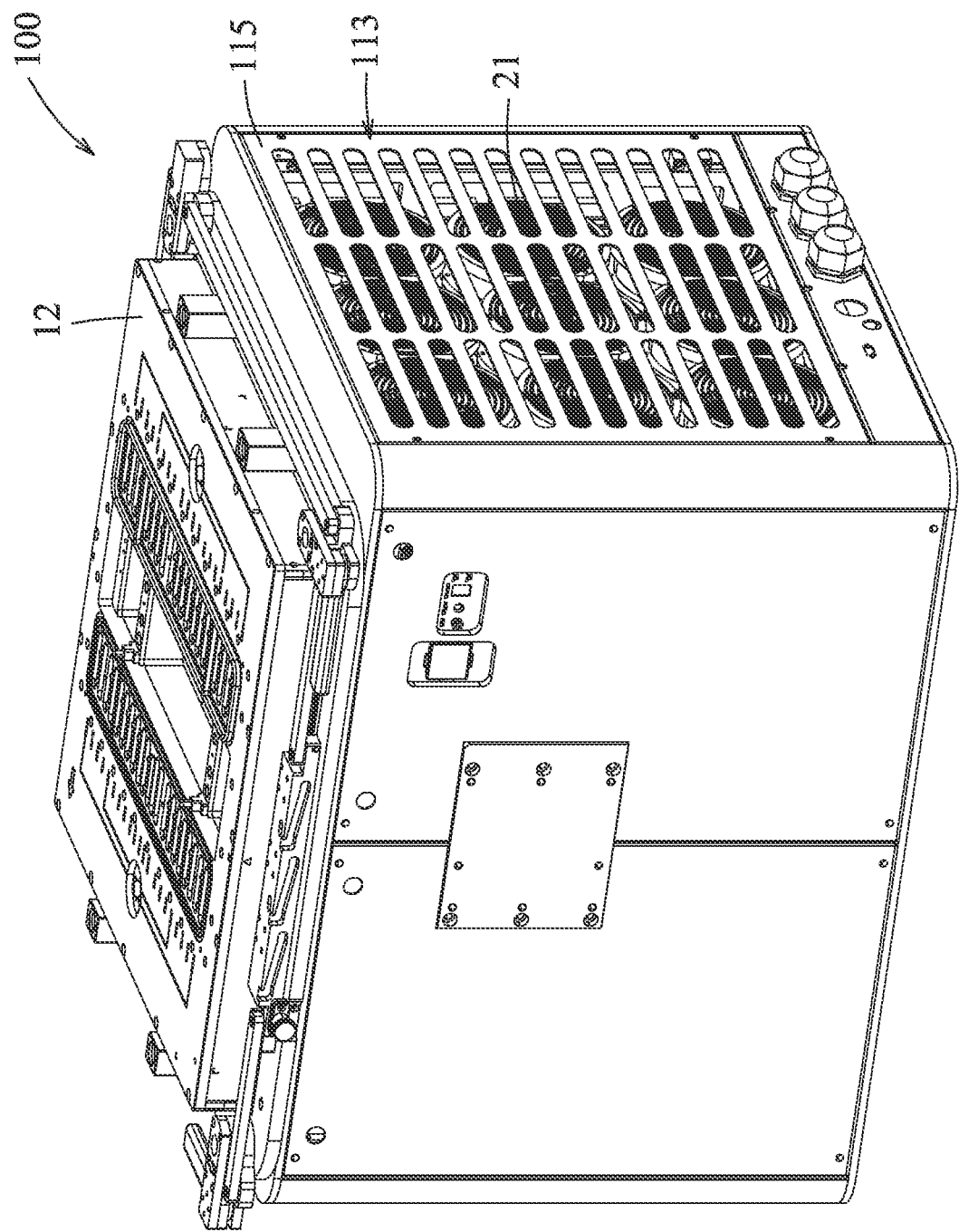
FIG. 1 is a perspective view of an embodiment of an electronic device of the disclosure.
Figure 2:
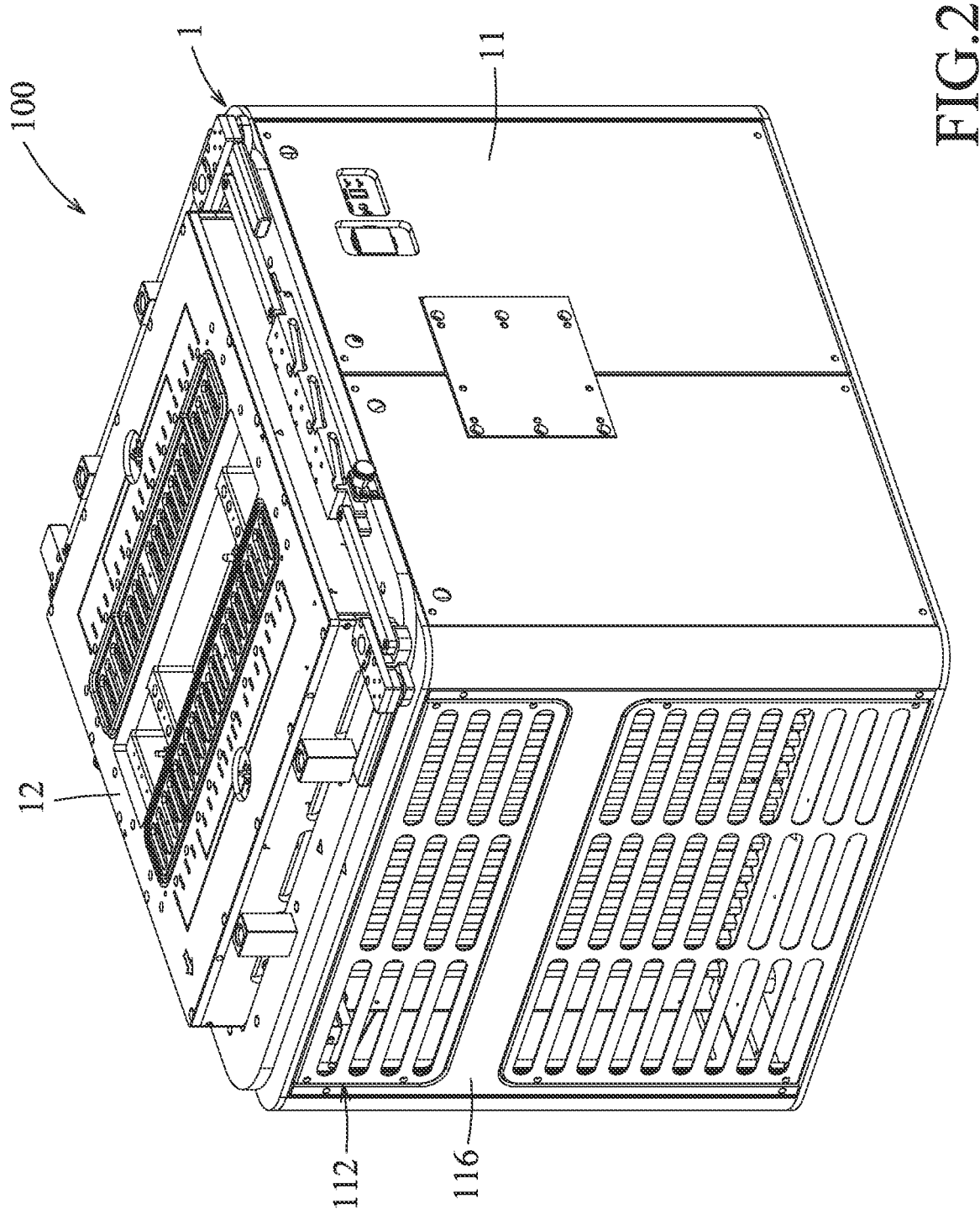
FIG. 2 is another perspective view of the embodiment taken from another angle.
Figure 3:
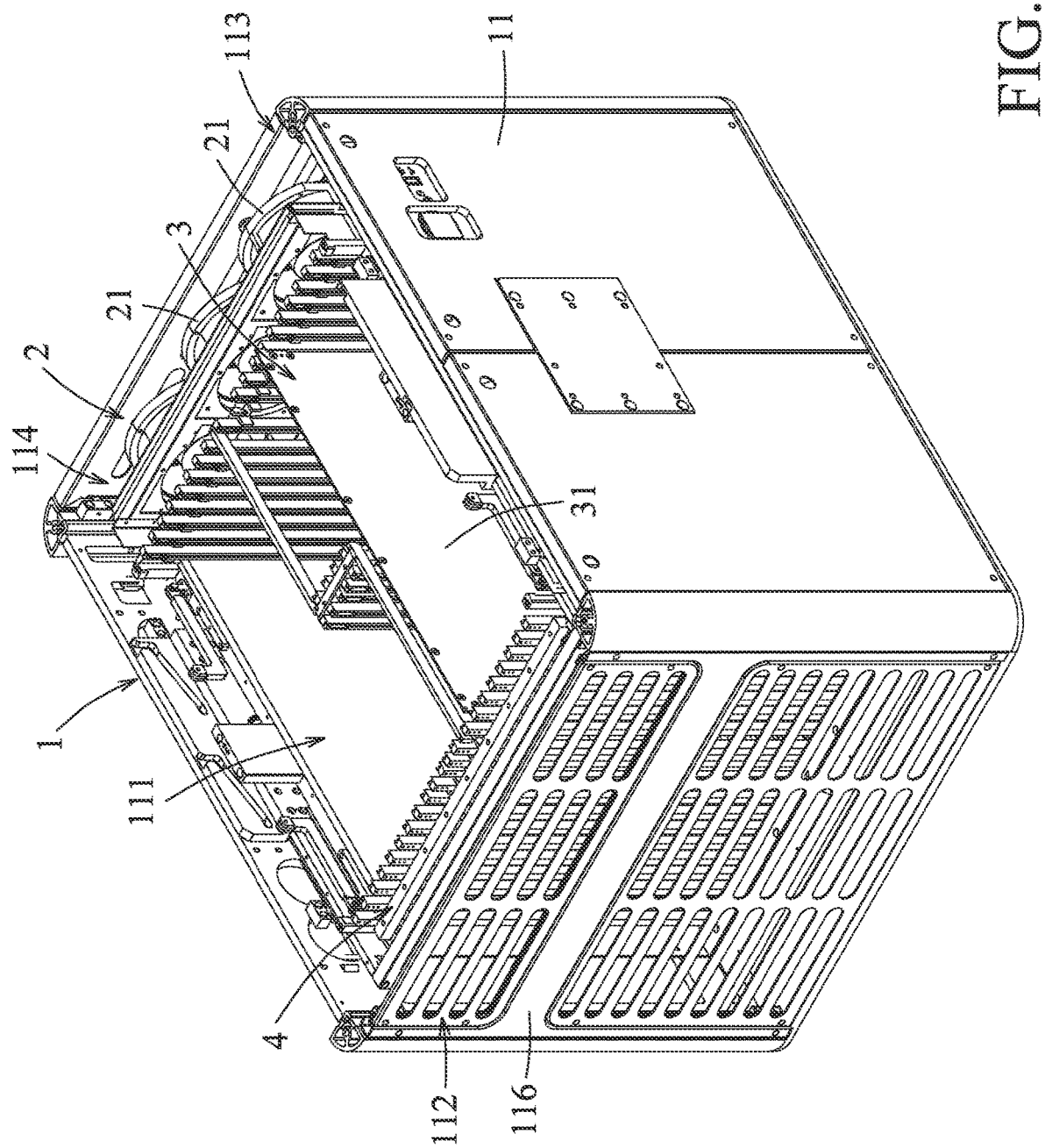
FIG. 3 is a perspective view of the embodiment with a test platform being removed.

Referring to FIGS. 1 to 3, an embodiment of an electronic device 100 of the present disclosure is adapted to detect a device under test (not shown), and includes a housing 1, a fan unit 2 and an electronic unit 3.

The housing 1 includes a housing body 11, an inlet module 4, and a test platform 12. The housing body 11 defines a receiving space 111 and has an inlet end 112 and an outlet end 113 which are disposed at two opposite sides. The receiving space 111 has a fan-mounting region 114 which is adjacent to the outlet end 113. The inlet module 4 is disposed in the housing body 11, and is adjacent to the inlet end 112. The test platform 12 is disposed on a top portion of the housing body 11 for contacting the device under test. The fan unit 2 is disposed in the fan-mounting region 114 and includes a plurality of fans 21 for guiding an air flow to enter the housing 1 from the inlet end 112 and to exit the housing 1 from the outlet end 113. The electronic unit 3 is disposed in the receiving space 111, and includes a plurality of test boards 31 (only a part of which is shown in FIG. 3) for measuring performance of the device under test. In this embodiment, the housing body 11 includes a front cover 115 proximate to the fan unit 2, and a rear cover 116 proximate to the inlet module 4.

Figure 4:
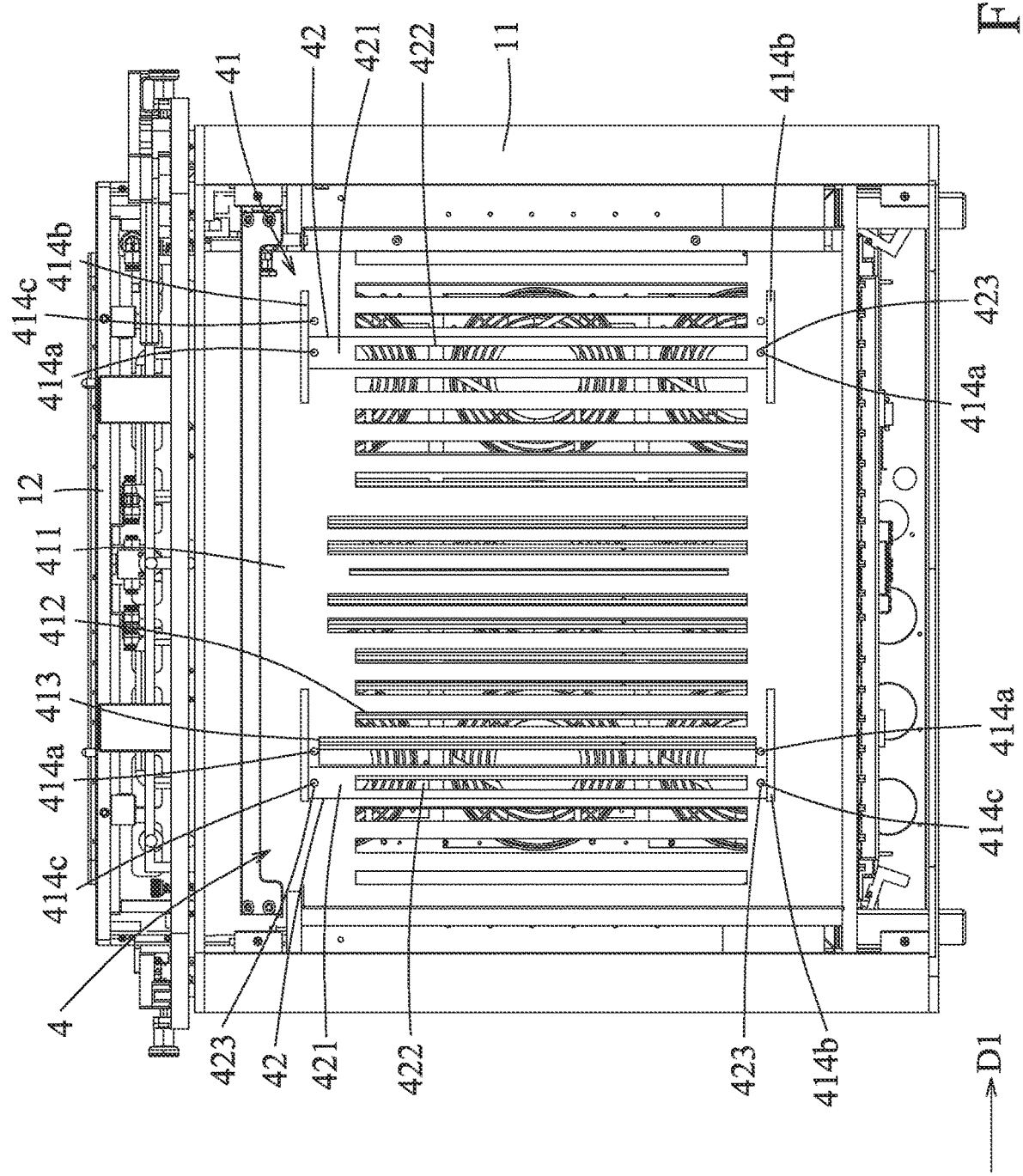
FIG. 4 is a rear view of the embodiment with a rear cover being removed to illustrate an inlet module.
Figure 6:
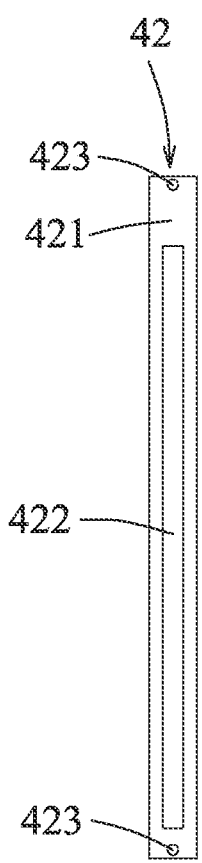
FIG. 6 is a side view of an adjusting plate of the inlet module.

Referring to FIGS. 4 and 6, the inlet 4 includes an insert board 41 and at least one adjusting plate 42, and is exemplified by two adjusting plates 42 in this embodiment.

The insert board 41 has a board body 411, a plurality of first air passages 412 formed by hollowing out the board body 411, at least one second air passage 413 formed by hollowing out the board body 411, and at least one positioning unit 414. In this embodiment, the insert board 41 has two second air passages 413 and two positioning units 414. However, in other embodiments, the number of the second air passages 413 may be adjusted according to actual needs. For example, the second air passage 413 may be one or more than two, and the number of the adjusting plate 42 and the positioning unit 414 is adjusted based on the number of the second air passages 413, so that each second air passage 413 is corresponding to one adjusting plate 42 and one positioning unit 414. For convenience of description, only one second air passage 413, one positioning unit 414, and one adjusting plate 42 that correspond to a single set, that is, one of the second air passages 413, a corresponding one of the positioning units 414, and a corresponding one of the adjusting plates 42 are described below.

The first and second air passages 412, 413 are disposed side by side in a first direction (D1), and the second air passage 413 is located between two of the first air passages 412. The second air passage 413 has an area larger than that of each first air passage 412. The positioning unit 414 is disposed on the board body 411 at a position that corresponds to the second air passage 413, and includes two first positioning portions 414a that are respectively proximate to two ends of the second air passage 413. The adjusting plate 42 has a plate body 421, an opening 422 formed by hollowing out the plate body 421 and having an area smaller than that of the second air passage 413, and two second positioning portions 423 disposed on the plate body 421. The adjusting plate 42 is selectively usable to connect the second positioning portions 423 respectively to the first positioning portions 414a so that the adjusting plate 42 is positioned, and that the opening 422 and the second air passage 413 are overlapped with each other, thereby reducing an area of the airflow passing through the second air passage 413. That is, a test board insertion slot (not shown) corresponding in position to the second air passage 413 may be disposed with the test board 31 that needs a larger area of the duct or a test board 31 that needs a smaller area of the duct. When the test board 31 that needs the smaller area or the duct is disposed, the second air passage 413 can be covered by the adjusting plate 42 to reduce the duct area. As such, the electronic device 100 has the flexibility of replacing the test board 31.

Figure 5:
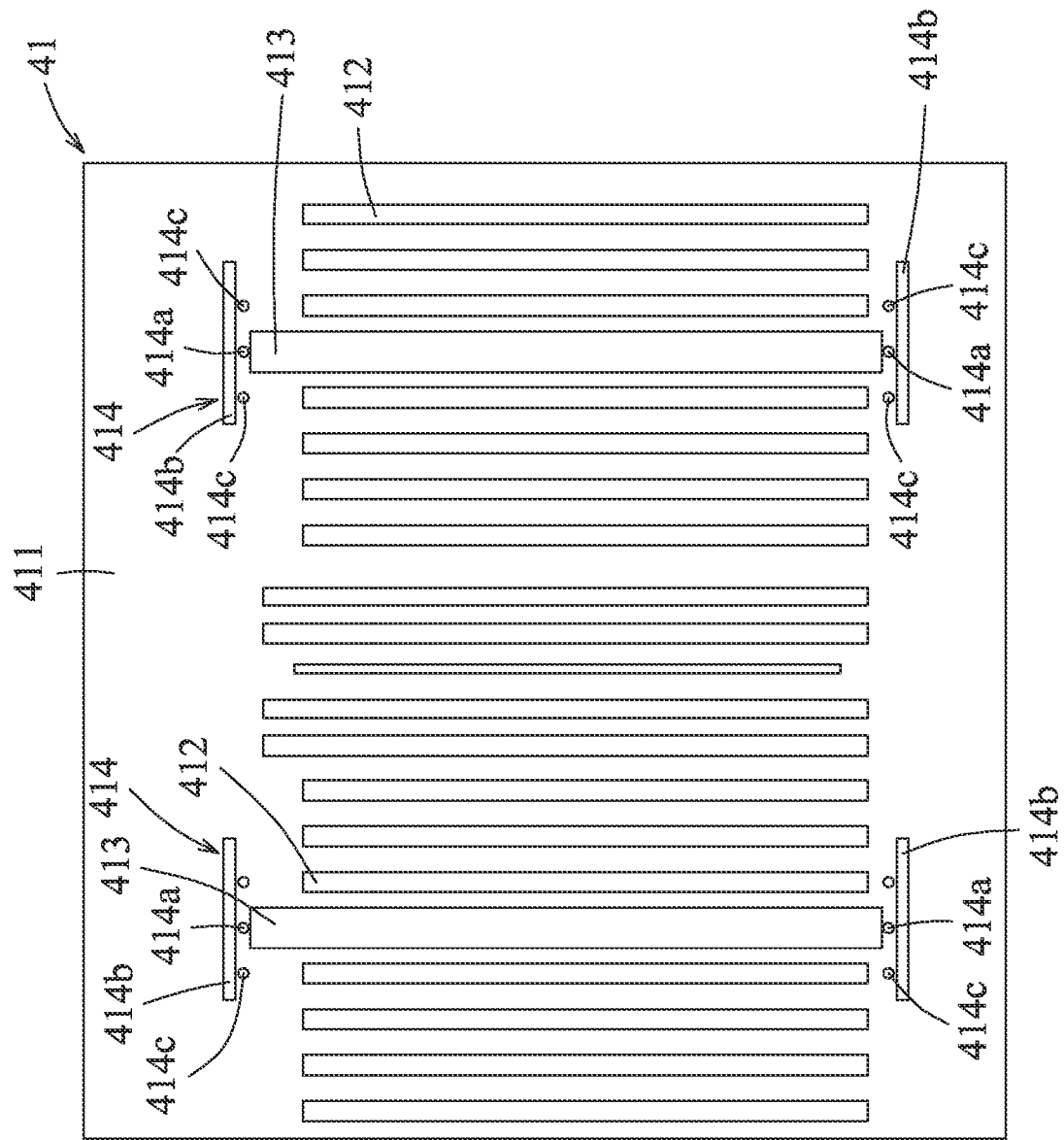
FIG. 5 is a side view of an insert board of the inlet module.

In order to conveniently operate the adjusting plate 42 and to prevent loss of the adjusting plate 42 while not in use to cover the second air passage 413, in this embodiment, the positioning unit 414 further includes a pair of rails 414b and two third positioning portions 414c provided on the board body 411. The rails 414b extend in the first direction (D1). The adjusting plate 42 is slidably disposed on the pair or rails 414b. The third positioning portions 414c are structurally identical to the first positioning portions 414a for positioning the adjusting plate 42. Through this, the adjusting plate 42 is slidable along the rails 414b between a blocking position (see FIG. 4, the adjusting plate 42 in the right side) where the adjusting plate 42 is connected to the first positioning portions 414a and where the opening 422 and the second air passage 413 are overlapped, and a receding position (see the adjusting plate 42 in the left side of FIG. 4) where the adjusting plate 42 is connected to the third positioning portions 414c and where the opening 422 and the second air passage 413 are not overlapped. Each of the first and third positioning portions 414a, 414c is a protrusion having a curved surface and protruding from the surface of the board body 411. The second positioning portions 423 are through holes that cooperate with the first and third positioning portions 414a, 414c. Through this, when the operator desires to adjust the position of the adjusting plate 42, as long as a slight force is applied, the adjusting plate 42 can be slid along the rails 414b and easily pass over the first and third positioning portions 414a, 414c having the curved surface. In this embodiment, the opening 422 has a shape and a size that are identical to those of each of the first air passages 412, so that the position of the third positioning portions 414c may be corresponding to one of the first air passages 412, thus when the adjusting plate 42 is connected to the third positioning portions 414c, the opening 422 is coincident with the corresponding first air passage 412. That is, when the adjusting plate 42 is in the receding position, the opening 422 is coincident with the corresponding first air passage 412, and the adjusting plate 42 will neither cover the first air passages 412 nor the second air passage 413. The third positioning portions 414c are preferably located corresponding to the first air passage 412 that is adjacent to the second air passage 413, so that the moving distance of the adjusting plate 42 is shortest and operation of the adjusting plate 42 can be conveniently conducted. In this embodiment, the positioning unit 414 has only two third positioning portions 413 corresponding in position to the one of the first air passages 412 that is disposed at one side of the second air passage 413. In other variations, as shown in FIG. 5, the positioning unit 414 may have two pairs of the third positioning portions 413 respectively corresponding in position to two of the first air passages 412 that are disposed at opposite sides of the second air passage 413. In other embodiments, the first positioning portions 414a may be threaded holes, and the operator may use, for example, screws to extend through the second positioning portions 423 to fix the adjusting plate 42 to the insert board 41. When the adjusting plate 42 is not used, the user can remove the adjusting plate 42.

In summary, by selecting whether the adjusting plate 42 is used to overlap the opening 422 and the second air passage 413, the air-intake area of the second air passage 413 can be adjusted to meet the heat dissipation requirement of different test boards 31. As such, the electronic device 100 has the flexibility to replace the test board 31.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure. While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. An inlet module adapted to be disposed on a housing of an electronic device, said inlet module comprising: an insert board having a board body, a plurality of first air passages that are formed by hollowing out said board body, at least one second air passage that is formed by hollowing out said board body, and at least one positioning unit, said first and second air passages being disposed side by side in a first direction, said at least one second air passage each being located between two of said first air passages, said at least one second air passage each having an area that is larger than that of each first air passage, each of said at least one positioning unit being disposed on said board body at a position that corresponds to a corresponding one of said at least one second air passage, and including two first positioning portions that are respectively proximate to two ends of said at least one second air passage; and at least one adjusting plate each having a plate body, an opening that is formed in said plate body and that has an area smaller than that of a corresponding one of said at least one second air passage, and two second positioning portions that are disposed on said plate body; wherein each of said at least one adjusting plate is selectively usable to connect said second positioning portions respectively to said first positioning portions so that said adjusting plate is positioned and that said opening and the corresponding one of said at least one second air passage are overlapped with each other, thereby reducing an area of the airflow passing through the corresponding one of said at least one second air passage.

2. The inlet module as claimed in claim 1, wherein said positioning unit further includes a pair of rails and two third positioning portions provided on said board body, said rails extending in the first direction, said adjusting plate being slidably disposed on said pair of rails, said third positioning portions being structurally identical to said first positioning portions for positioning said adjusting plate, said adjusting plate being slidable along said rails between a blocking position, where said adjusting plate is connected to said first positioning portions and where said opening and said second air passage are overlapped, and a receding position, where said adjusting plate is connected to said third positioning portions and where said opening and said second air passage are not overlapped.

3. The inlet module as claimed in claim 2, wherein each of said first and third positioning portions is a protrusion having a curved surface and protruding from a surface of said board body, said second positioning portions being through holes that cooperate with said first and third positioning portions.

4. The inlet module as claimed in claim 2, wherein said opening has a shape and a size that are identical to those of each of said first air passages, said third positioning portions being disposed at a position that corresponds to one of said first air passages, said opening being coincident with said one of said first air passages when said adjusting plate is at the receding position.

5. A housing, comprising:
a housing body defining a receiving space and having an inlet end and an outlet end that are disposed at two opposite sides, said receiving space having a fan-mounting region that is adjacent to said outlet end; and
the inlet module as claimed in claim 1 disposed in said housing body, and adjacent to said inlet end.

6. The housing as claimed in claim 5, wherein said positioning unit further includes a pair of rails and two third positioning portions provided on said board body, said rails extending in the first direction, said adjusting plate being slidably disposed on said pair of rails, said third positioning portions being structurally identical to said first positioning portions for positioning said adjusting plate, said adjusting plate being slidable along said rails between a blocking position, where said adjusting plate is connected to said first positioning portions and where said opening and said second air passage are overlapped, and a receding position, where said adjusting plate is connected to said third positioning portions and where said opening and said second air passage are not overlapped.

7. The housing as claimed in claim 6, wherein each of said first and third positioning portion is a protrusion having curved surface and protruding from a surface of said board body, said second positioning portions being through holes that cooperate with said first and third positioning portions.

8. The housing as claimed in claim 6, wherein said opening has a shape and a size that are identical to those of each of said first air passages, said third positioning portions being disposed at a position that corresponds to one of said first air passages, said opening being coincident with said one of said first air passages when said adjusting plate is at the receding position.

9. An electronic device, comprising:
said housing as claimed in claim 5;
a fan unit disposed in said fan-mounting region for guiding an air flow to enter said housing from said inlet end and to exit said housing from said outlet end; and
an electronic unit disposed in said receiving space.

10. The electronic device as claimed in claim 9, wherein said positioning unit further includes a pair of rails and two third positioning portions disposed on said board body, said rails extending in the first direction, said adjusting plate being slidably disposed on said pair of rails, said third positioning portions being structurally identical to said first positioning portions for positioning said adjusting plate, so that said adjusting plate being slidable along said rails between a blocking position, where said adjusting plate is connected to said first positioning portions and where said opening and said second air passage are overlapped, and a receding position, where said third positioning portions and where said opening and said second air passage are not overlapped.

11. The electronic device as claimed in claim 10, wherein each of said first and third positioning portions is a protrusion having curved surfaces and protruding from a surface of said board body, said second positioning portions being through holes that cooperate with said first and third positioning portions.

12. The electronic device as claimed in claim 10, wherein said opening has a shape and a size that are identical to those of each of said first air passages, said third positioning portions corresponding in position to one of said first air passages, said opening being coincident with said one of said first air passages when said adjusting plate is at the receding position.

13. The electronic device as claimed in claim 9, wherein said housing further includes a test platform disposed on a top portion of said housing body for contacting a device under test, said electronic unit including a plurality of test boards for measuring performance of the device under test.

* * * * *